United States Patent [19]

Magdo et al.

[11] 3,774,088

[45] Nov. 20, 1973

[54] INTEGRATED CIRCUIT TEST TRANSISTOR STRUCTURE AND METHOD OF FABRICATING THE SAME

[75] Inventors: Ingrid E. Magdo; Steven Magdo, both of Hopewell Junction, N.Y.

[73] Assignee: International Business Machines Corporation, Armonk, N.Y.

[22] Filed: Dec. 29, 1972

[21] Appl. No.: 319,120

[52] U.S. Cl. 317/235 R, 317/235 D, 317/235 WW, 317/235 AJ

[51] Int. Cl. .................................... H01l 9/00

[58] Field of Search..................... 317/235, 22, 40.1, 317/47

[56] References Cited

UNITED STATES PATENTS

| | | | |
|---|---|---|---|
| 3,335,340 | 8/1967 | Barson et al. | 317/235 |
| 3,539,876 | 11/1970 | Feinberg et al. | 317/101 |

*Primary Examiner*—John W. Huckert
*Assistant Examiner*—E. Wojciechowicz
*Attorney*—Julius B. Kraft et al.

[57] ABSTRACT

In a planar semiconductor integrated circuit substrate having a plurality of functional vertical transistors extending from said surface into the substrate, wherein each of the transistors comprises an emitter, base and collector extending from the surface, there is provided a test transistor having an emitter region with a first portion substantially identical to the emitters of the functional transistors in conductivity-determining profile as well as horizontal and vertical dimensions, and a second portion continuous with the first portion which has said identical profile and vertical dimensions but greatly expanded horizontal dimensions. Likewise, the test transistor has a base region with a first active portion having a profile and horizontal and vertical dimensions substantially identical with the bases of the functional transistors, and a second portion with said profile and vertical dimensions but with greatly expanded horizontal dimensions at the substrate surface.

8 Claims, 7 Drawing Figures

INTEGRATED CIRCUIT TEST TRANSISTOR STRUCTURE AND METHOD OF FABRICATING THE SAME

BACKGROUND OF THE INVENTION

The present invention relates to monolithic semiconductor planar integrated circuit structures which may be masterslices, and is particularly directed to semiconductor structures in the integrated circuits for testing purposes, especially test transistors. Planar integrated circuits, in general, comprise a plurality of passive devices such as resistors and active devices such as transistors formed at the planar surface of a semiconductor member which may conventionally be a semiconductor member supporting an epitaxial layer containing the planar surface. Integrated circuits of the type described and appropriate methods for the fabrication thereof are well known in the art and are described, for example, in U.S. Pat. No. 3,539,876. As set forth in said patent, fabrication involves a series of steps during which conductivity-determining impurities are selectively introduced into various regions in the semiconductor substrate to form the operative regions of the active and passive devices. Selective arrangement of the introduced impurities is customarily controlled through a series of masks used during the respective introduction steps. In more advanced technologies, electrical and electromagnetic fields may be utilized in place of masks to control such selective introduction. While diffusion has been conventionally the most extensively used method for the introduction of impurities, other methods such as ion implantation have also been used.

During the fabrication of the integrated circuit, it is often advantageous to monitor certain characteristics of the transistors being fabricated, such as breakdown voltages, including $BV_{CBO}$ (the collector-base breakdown, emitter open), $BV_{CES}$ (breakdown between the collector and emitter with the emitter-base shorted), and $BV_{EBO}$ (breakdown emitter-base, collector open). Should any of these characteristics monitored during processing fall outside of predetermined values, it is possible during the processing to alter vertical transistor dimensions as well as impurity distribution profiles by changing time, temperature or impurity concentrations during the impurity introduction steps.

Because of size and spacing densities, the functional transistors in the integrated circuit have not in general been readily accessible for monitoring of characteristics during the fabrication processes. As a result, the art has utilized test transistors for such purposes. Such test transistors have either been located within the limits of the chip proper or in cases where "real estate" on the chip is sparse, in the kerf located between the chips on a wafer. In the latter case, upon completion of chip fabrication when, of course, the test transistor is no longer needed, it is removed together with the kerf during the dicing of the wafer into the chips. Such test transistors are shown and described in the aforementioned U.S. Pat. No. 3,539,876 (See FIGS. 4 and 6 in the patent).

While the vertical dimensions of the regions in such test transistors as well as the conductivity-determining impurity concentration profile within said regions have been substantially the same as those of the correspodding regions of the functional transistors, the horizontal dimensions of the regions in the test transistors have been much greater than those of the corresponding regions in the functional transistors. The primary reason for this difference in horizontal dimensions appears to be that probing or contacting such transistors must take place before any metallization is applied to the integrated circuit being fabricated. It is only during this period prior to metallization, that necessary adjustments may be made in the time, temperature or impurity concentration fabrication parameters. Consequently, because contact to the regions in the test transistor is made without any metallization present, the contact must be made directly to the region with probes which are relatively large in comparison with actual functional contacts through relatively large openings or holes in any insulative surface layer such as silicon dioxide which may be present.

However, the requisite discrepancy in horizontal dimensions between the regions in the test transistor and those in the functional transistor appears not to have presented a problem to the prior art since the art apparently found that these discrepancies had no effect on vertical dimensions or impurity concentration profiles and consequently no effect on the aforementioned transistor characteristics dependent on such parameters. As a result, the readings from the test transistors were apparently consistent with the characteristics of the functional transistor and the process could be controlled and adjusted based upon such test transistor readings.

We have now discovered that while discrepancies in horizontal dimensions between test and functional transistors apparently had no effect on the fabrication of earlier integrated circuit structures which were less dense and had relatively large transistor dimensions, the significantly denser integrated circuits with transistors of substantially reduced dimensions which are presently being developed and will be developed in future integrated circuits can no longer tolerate such differences in horizontal dimensions. The structure of the present invention is based upon this discovery.

SUMMARY OF THE INVENTION

Accordingly, the primary object of the present invention is to provide a test transistor structure for integrated circuits which gives test parameters consistent with those of the functional transistors in the integrated circuit.

It is another object of the present invention to provide a test transistor in an integrated circuit structure which may be utilized during the fabrication of the integrated circuit to give test parameters consistent with those of the functional transistors in the circuit being fabricated.

It is a further object of the present invention to provide a test transistor in an integrated circuit structure which may be utilized during integrated circuit fabrication to give parameters consistent with those of the functional transistors, even in the case of a relatively minute transistor in highly dense large scale integrated circuits.

It is an even further object of the present invention to provide a test transistor structure in an integrated circuit which is readily accessible during the integrated circuit fabrication stages by relatively large test probing means and yet provides test parameters consistent with those of functional transistors in the integrated circuit.

In accordance with the present invention there is provided in an integrated circuit having a plurality of functional transistors, a test transistor comprising an emitter region having a first active portion with a conductivity-determining profile as well as horizontal and vertical dimensions substantially identical with the emitters of the functional transistors and a second portion continuous with the first portion which has the same conductivity determining profile and vertical dimensions but with greatly expanded horizontal dimensions at the substrate surface. The test transistor further includes a base region with a first active portion having a conductivity-determining profile as well as horizontal and vertical dimensions substantially identical with the basis of the functional transistor and a second portion continuous with the first portion with the same profile and vertical dimension but with greatly expanded horizontal dimensions at the substrate surface. The collector region of the test transistor has at least an intrinsic portion with a conductivity-determining profile and horizontal and vertical dimensions substantially identical with the intrinsic collectors of the functional transistors. By the intrinsic collector, we mean the part of the collector region in the functional transistor which overlaps the base and is thus horizontally coextensive with the base to provide the active base collector junction.

In the novel test transistor structure, the combination of the first portion of the emitter, the first portion of the base and the intrinsic collector provide a structure which is substantially identical with the functional transistor while the second expanded portion of the regions which are respectively continuous with the emitter and base regions provide the means whereby the test transistor may be contacted at a premetallization stage during the transistor fabrication with the test probes in order to obtain the various transistor parameters at intermediate processing stages. The resulting test transistor provides readings of transistor parameters during fabrication which are consistent with corresponding parameters in the functional transistor.

Without intent to bind the present invention to our explanation, we believe that the reasons for the improved consistency between our test transistor and functional transistor parameters include at least two factors among others. First, the effect of pin holes on our test transistors is statistically identical with their effect on the functional transistor. Since a single pin hole may short out a base region in the transistor, our test transistors are not likely to experience more of such shorts than the functional transistors. On the other hand, test transistors which were larger than the functional transistors would appear to be statistically more likely to have such shorts than their corresponding functional transistors. Naturally, the smaller the functional transistors became in large scale integrated circuitry, the wider this divergence in the effect of pin holes would be expected to become.

Secondly, where the impurities forming the active transistor region are introduced through very small mask openings in the order of 50–600 microinches as would be the case in large scale integrated circuitry, the horizontal dimensions of the openings appear to have an effect on the vertical dimensions, which related to diffusion depth, and impurity concentration profile of these active regions if all other conditions and concentrations remain constant. For example, it appears that diffusion through a horizontally larger mask opening will proceed to a greater depth than would the identical diffusion when made through a smaller opening in the order of the diffusion openings utilized in large scale integrated circuitry.

In addition, in the structures utilizing buried subcollectors under epitaxial layers, the heavily doped subcollector regions undergo "auto-doping" during epitaxial deposition. This auto-doping involves a horizontal and vertical expansion of the sub-collector region. The extent of such auto-doping is directly related to the horizontal dimensions of the sub-collector. Hence, in order to insure that the effects of auto-doping will be consistent in the test transistor, its intrinsic subcollector should have the same horizontal dimensions as the functional transistor.

If the functional transistor structure is such that the collector region beyond the intrinsic collector is relatively large, then the test transistor structure need not be said to require an expanded portion in addition to the intrinsic portion since the large contact portion of the collector region in the test transistor would have horizontal dimensions in the order of the dimensions of the corresponding portion of the functional transistor collector. However, if the functional transistor has a collector or buried subcollector which is imited in overall horizontal dimensions, the test transistor structure of the present invention may be said to have a portion in addition to the intrinsic collector or subcollector portion with greatly expanded horizontal dimensions.

The foregoing and other objects, features and advantages of the invention will be apparent from the following more particular description and preferred embodiments of the invention as illustrated in the accompanying drawings.

DESCRIPTION OF THE PREFERRED EMBODIMENTS

Figure 1A:
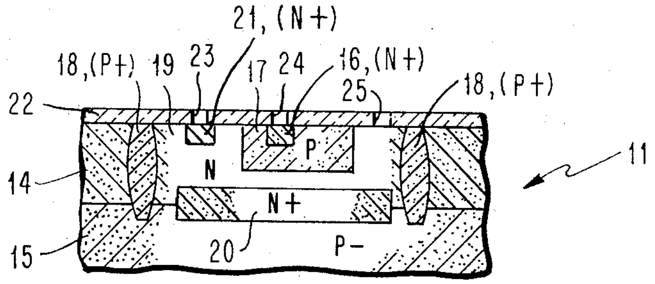
FIG. 1A is a diagrammatic fragmentary cross-sectional view along line 1A—1A of FIG. 1 which illustrates the cross-section of a functional transistor in the circuit.
Figure 1B:
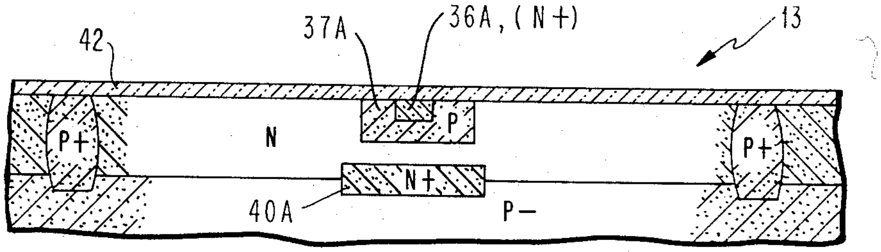
FIG. 1B is a diagrammatic, fragmentary, cross-sectional view along line 1B—1B of FIG. 1 which illustrates the cross-section of the active portion of the test transistor.
Figure 1C:
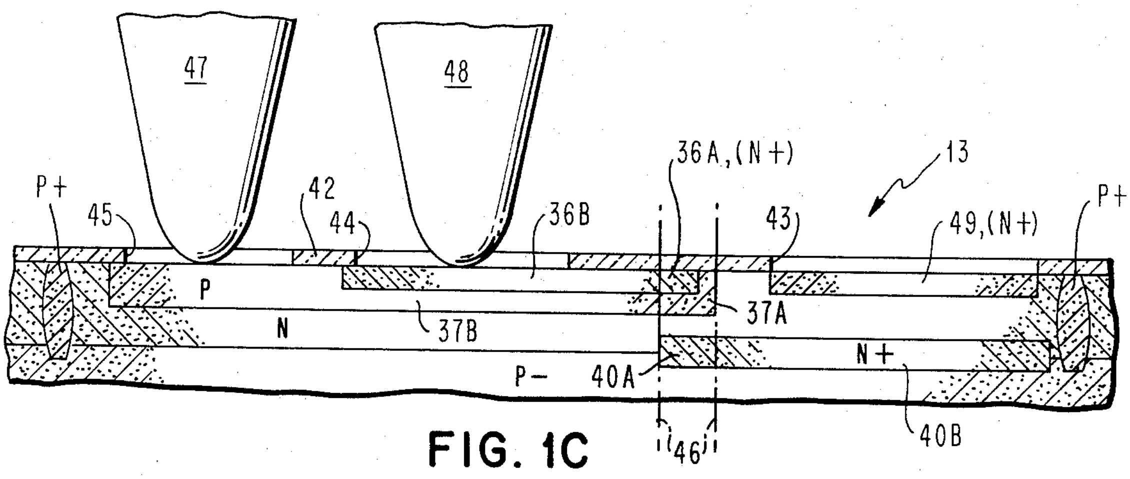
FIG. 1C is a diagrammatic, fragmentary, cross-sectional view along line 1C—1C of FIG. 1 which illustrates the longitudinal cross-section of the test transistor.
Figure 1:
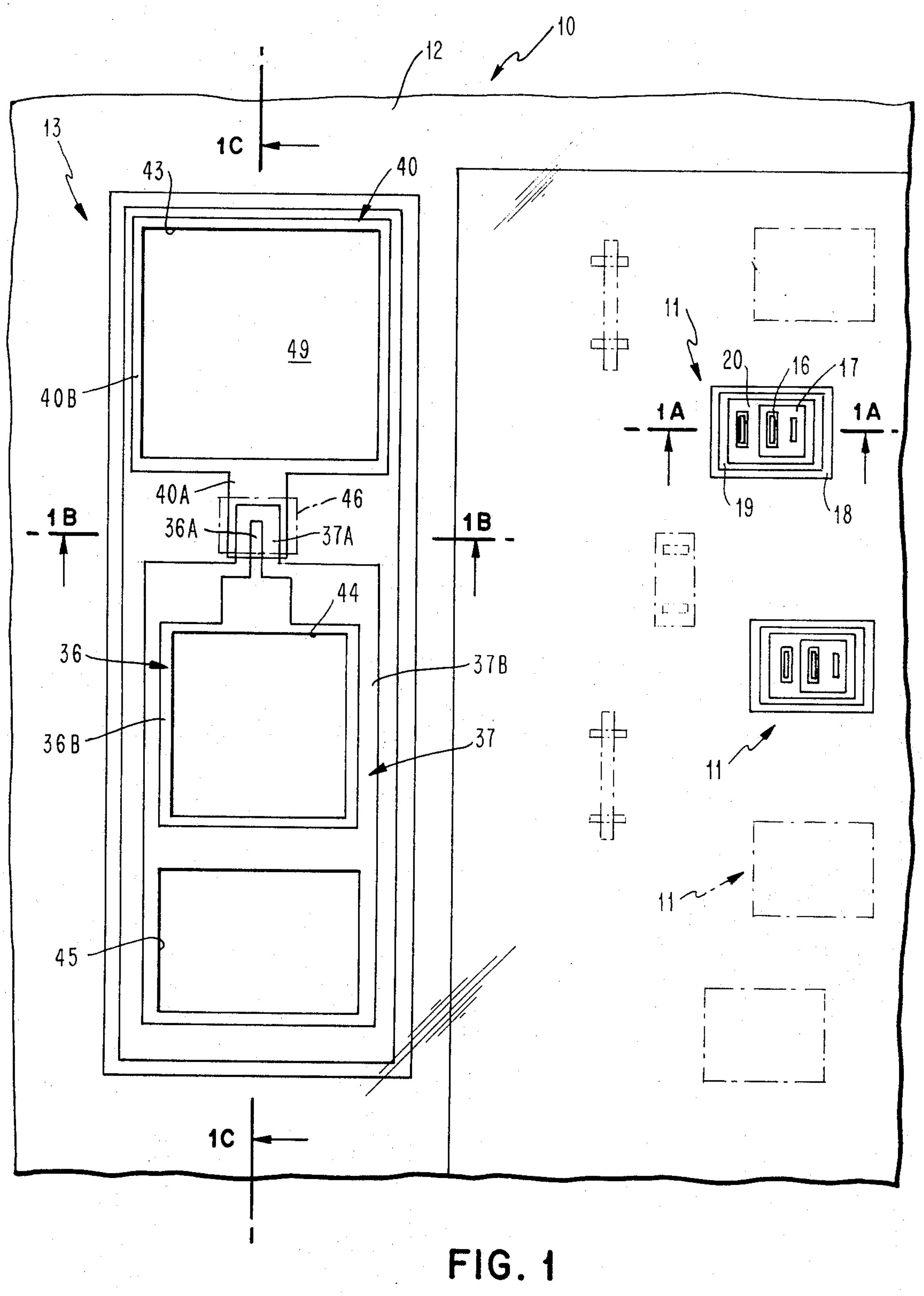
FIG. 1 is an illustrative top view of a portion of a planar surface of an integrated circuit chip and kerf which includes the test transistor structure of the present invention.

With reference to FIGS. 1, 1A, 1B and 1C, there will now be described a specific embodiment of the present invention. In the plan view of FIG. 1, integrated semiconductor circuit substrate 10 contains a plurality of functional transistors 11. For simplicity in explanation of the present invention, only functional transistors have been shown in detail in the integrated circuit. Other devices such as resistors, conductors, and diodes have been eliminated from the circuitry and are illustrated in phantom lines. In the kerf bordering chip 12, test transistor 13 is shown. An enlarged cross-sectional view of a functional transistor along line 1A—1A is shown in FIG. 1 and an enlarged cross-sectional view of the test transistor along line 1B—1B is shown in FIG. 1B.

While the integrated circuit structure shown may be fabricated in a variety of known semiconductor fabrication procedures, including ion implantation, the embodiment being described is fabricated using the diffusion techniques described in U.S. Pat. No. 3,539,876. Because the details of fabrication are very comprehensively set forth in U.S. Pat. No. 3,539,876, they will not be described in the present specification. Functional transistor 11 and test transistor 13 are formed in substrate 10 which comprises N type epitaxial layer 14 on P- supporting semiconductor member 15. The functional transistor comprises N+ emitter 16, P base 17, P+ isolation diffusion 18 which traverses epitaxial layer 14 to enclose N collector region 19. Buried N+ subcollector 20 is formed under base region 17, and N+ collector diffusion 21 is formed at the surface proximate to the collector contact. A layer of insulative material 22, e.g., $SiO_2$ is formed over the surface of the integrated circuit substrate. Openings 23, 24 and 25 through insulative layer 22 respectively are the collector, emitter and base contact openings.

Test transistors 13, the regions of which are formed simultaneously with their corresponding regions in functional transistor 11 comprises emitter region 36. This emitter region is made up of two portions, emitter portion 36A which is substantially identical with emitter region 16 in the functional transistor in both vertical and horizontal dimensions. Portion 36B of the test transistor emitter has greatly expanded horizontal dimensions, sufficiently large so that a test probe may contact emitter 36 through contact opening 44 in insulative layer 42 which covers the test transistor. Since emitter 36 is fabricated simultaneously with emitters 16 in the functional transistors, portion 36A of the test transistor emitter should be substantially identical with emitter 16 in horizontal and vertical dimensions as well as impurity concentration profile.

The test transistor further includes base region 37 which comprises portion 37A which has substantially the same horizontal dimensions as base region 17 in the functional transistor, and portion 37B having greatly expanded horizontal dimensions. The dimensions of base region portion 37B are such that a test probe can contact the base region in the test transistor through contact opening 45 in insulative layer 42. Thus, the test transistor base region includes an enlarged portion 37B for contact purposes and a portion 37A which is identical with the base region in the functional transistor in both horizontal and vertical dimensions as well as conductivity-determining impurity profile.

The test transistor likewise includes a buried subcollector region 40 which includes a first portion 40A and an enlarged portion 40B to which a test probe contact may be made through contact opening 43 through insulative layer 42. Since the subcollector region 40 in the test transistors are formed simultaneously with the subcollector regions 20 in the functional transistors, portion 40A of the subcollector will have both horizontal and vertical geometry as well as conductivity-determining impurity concentration profile substantially identical with that of the intrinsic portion of subcollector 20 in the functional transistor. As previously stated, by intrinsic subcollector, we mean that portion of subcollector 20 which is horizontally overlapped by base region 17.

Thus, in the test transistor we have a transistor portion within the limits enclosed by broken line 46, a transistor which is substantially identical to the active portions of functional transistor 11 in both vertical and horizontal dimensions of the emitter base and intrinsic collector and in the conductivity-determining impurity concentration profiles in these regions. Consequently, this portion of the test transistor should provide electrical parameters substantially identical with those of the functional transistors 11. In addition, since each of these active regions in the transistor have an enlarged additional portion continuous with the active portion, the test transistor may be readily accessed by conventional test probes during various fabrication stages.

The test transistor described is seen in longitudinal cross-section in FIG. 1C. The active portion of the test transistor is shown defined within the limits of broken lines 46. Test probes 47 and 48 are shown in place respectively to base extension 37B and emitter extension 36B. The probes are connected to a tester, not shown, which may be considered to be a conventional tester for determining the various electrical parameters which may be sampled during semiconductor fabrication prior to the application of the metallization. In the case shown, since the probes are respectively connected to the emitter and base, we may assume that $BV_{EBO}$, the emitter base breakdown voltage is being determined. Of course, by other suitable combinations of the probes respectively to combinations of the emitter and base extensions as well as the subcollector extension in the test transistor, other characteristics may be tested for. Where the collector is to be involved in a test, one of the test probes is applied through opening 43 into contact with collector contact 49 to provide a suitable connection to subcollector extension 40B.

If the integrated circuit is being fabricated in accordance with the process set forth in U.S. Pat. No. 3,539,876, the test probes may be applied to various combinations of base, emitter and collector extensions in the test transistor after the base diffusion, the base drive-in, the emitter diffusion, and the emitter drive-in. Based upon the test results of these various stages of fabrication, impurity concentration, as well as time/-temperature cycles may be altered in order to adjust the characteristics necessary to bring functional transistors into preselected transistor specifications.

Figures 2, 2A, 2B:
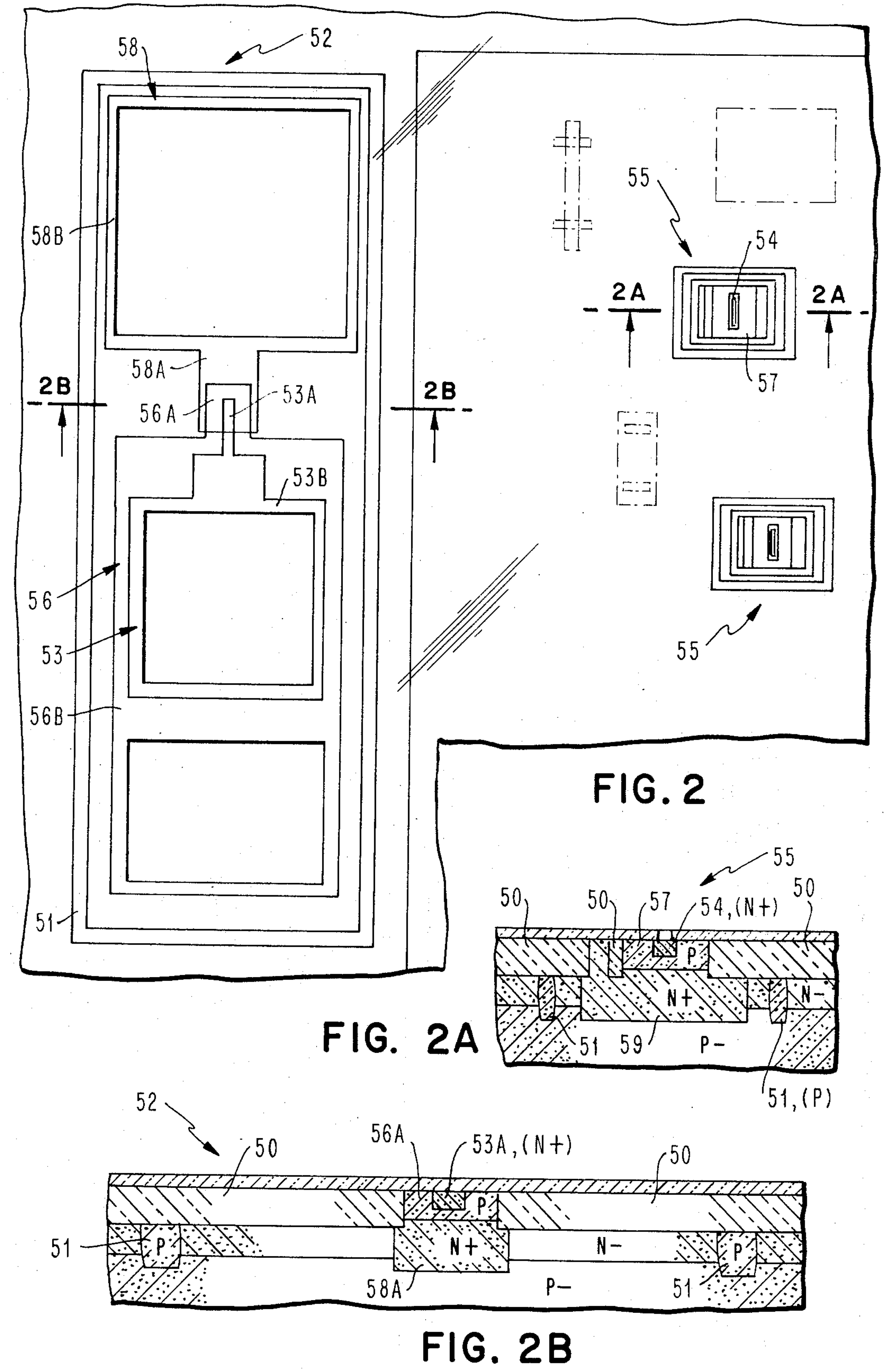
FIG. 2 is an illustrative top view of a portion of a planar surface of an alternative embodiment of an integrated circuit chip and kerf which includes the test transistor structure of the present invention.
FIG. 2A is a diagrammatic, fragmentary, cross-sectional view along line 2A—2A of FIG. 2 which illustrates the cross-section of a functional transistor in the alternative embodiment.
FIG. 2B is a diagrammatic, fragmentary, cross-sectional view along line 2B—2B of FIG. 2 which illustrates the cross-sectional view of the active portion of a test transistor in the alternative embodiment.

An additional embodiment of the present invention is shown in FIGS. 2, 2A and 2B. FIG. 2 is a plan view corresponding to FIG. 1 and FIGS. 2A and 2B are respectively cross-sections of the functional transistor and the test transistor corresponding to FIGS. 1A and 1B. Like the embodiment in FIG. 1, the embodiment in FIG. 2 is also formed by a diffusion process. It differs from that of FIG. 1 primarily in the use of recessed oxide regions 50 in both the functional and test transistors to define the regions of the transistor and to supplement isolation regions 51 in providing integrated circuit isolation. The method for fabricating the structure of FIGS. 2 through 2B utilizes conventional masking, etching and diffusion techniques, and is described in our copending application, Ser. No. 150,609 filed June 7, 1971, entitled "Dielectric Isolation for High Density Semiconductor Devices." The test transistor 52 comprises an emitter 53 having an active first portion 53A which corresponds to emitter region 54 in functional transistor 55 and an extended region 53B which is enlarged similarly to the emitter in the test transistor of FIG. 1 for the purpose of making test probe contact. Likewise, the test transistor has a base 56 which has an active portion 56A corresponding to the base region 57 in functional transistor 55, and an enlarged portion 56B for facilitating probe contact. In addition, the test transistor 52 comprises a subcollector 58 having a first portion 58A corresponding to the intrinsic subcollector 59 in the functional transistors, and an enlarged portion 58B for contact probe purposes.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a planar semiconductor integrated circuit substrate comprising a planar surface from which a plurality of functional vertical transistors extend into the substrate, each of said transistors comprising an emitter region of one-type conductivity extending from said surface into the substrate, a base region of opposite type conductivity abutting said emitter region and extending from said surface into the substrate beneath said emitter region and a collector region of said one-type conductivity beneath said base region, the improvement of said substrate further includes a test transistor structure comprising an emitter region having a first portion with a conductivity-determining profile and horizontal and vertical dimensions substantially identical with the emitters of the functional transistors and a second portion continuous with said first portion with said porfile and vertical dimensions but with greatly expanded horizontal dimensions at said substrate surface, a base region having a first portion with a conductivity-determining profile and horizontal and vertical dimensions substantially identical with the bases of the functional transistors and a second portion continuous with said first portion with said profile and vertical dimensions but with greatly expanded horizontal dimensions at said substrate surface, and a collector region having at least an intrinsic portion with a conductivity-determining profile and horizontal and vertical dimensions substantially identical with the intrinsic collectors of the functional transistors.

2. The integrated circuit structure of claim 1 wherein said test transistor collector region further includes an additional portion continuous with said intrinsic portion, said additional portion having the profile and vertical dimensions of the functional transistor collector and greatly expanded horizontal dimensions at said substrate surface.

3. The structure of claim 1 wherein said substrate comprises an array of chips respectively separated from each other by kerf regions and said test transistor is located in said kerf.

4. In a planar semiconductor integrated circuit structure comprising a supporting substrate and an epitaxial layer formed on said substrate, from the surface of which layer a plurality of functional vertical transistors extend into the epitaxial layer, each of said transistors comprising an emitter region of one-type conductivity extending from said surface into the layer, a base region of opposite type conductivity abutting said emitter region and extending from said surface into the layer beneath said emitter region and a buried sub-collector region of said one-type conductivity beneath said base region, the improvement of said substrate further includes a test transistor structure comprising an emitter region having a first portion with a conductivity-determining profile and horizontal and vertical dimensions substantially identical with the emitters of the functional transistors and a second portion continuous with said first portion with said profile and vertical dimensions but with greatly expanded horizontal dimensions at said epitaxial layer surface, a base region having a first portion with a conductivity-determining profile and horizontal and vertical dimensions substantially identical with the bases of the functional transistors and a second portion continuous with said first portion with said profile and vertical dimensions but with greatly expanded horizontal dimensions at said layer surface, and a buried sub-collector region having an intrinsic portion with a conductivity-determining profile and horizontal and vertical dimensions substantially identical with the intrinsic sub-collectors of the functional transistors, and an additional portion continuous with said first portion with said profile and vertical dimensions but with greatly expanded horizontal dimensions at said layer surface.

5. The structure of claim 4 wherein said structure comprises an array of chips respectively separated from each other by kerf regions and said test transistor is located in said kerf.

6. In the method of fabricating, by series of steps involving the selective introduction of conductivity-determining impurities, a planar semiconductor integrated circuit substrate comprising a planar surface from which a plurality of functional vertical transistors extend into the substrate, each of said transistors comprising an emitter region of one-type conductivity extending from said surface into the substrate, a base region of opposite type conductivity abutting said emitter region and extending from said surface into the substrate beneath said emitter region, and a collector region of said one-type conductivity beneath said base region, the improvement of forming a test transistor in the following steps:

forming simultaneously with the emitter regions in the functional transistors under identical conditions in a single selective introduction step, an emitter region having a first portion with a conductivity-determining profile and horizontal and vertical dimensions substantially identical with the emitters of the functional transistors and a second portion continuous with said first portion with said profile and vertical dimensions but with greatly expanded horizontal dimensions at said substrate surface, forming simultaneously with base regions in the functional transistors under directional conditions in a single selective introduction step, a base region having a first portion with a conductivity-determining profile and horizontal and vertical dimensions substantially identical with the bases of the functional transistors and a second portion continuous with said first portion with said profile and vertical dimensions but with greatly expanded horizontal dimensions at said substrate surface, and forming simultaneously with the collector regions in the functional transistors under identical conditions, a collector region having at least an intrinsic portion with a conductivity-determining profile and horizontal and vertical dimensions substantially identical with the intrinsic collectors of the functional transistors;

testing for the characteristics of the functional transistors prior to the completion of the fabrication method by contacting said second portions of said test transistor regions with test probes; and based upon said test results, selectively changing fabrication conditions to selectively adjust the vertical dimensions and conductivity-determining profiles of the functional transistor regions.

7. The method of claim 6 wherein said test transistor collector region further includes an additional portion continuous with said intrinsic portion, said additional portion having the profile and vertical dimensions of the functional transistor collector and greatly expanded horizontal dimensions at said substrate surface.

8. The method of claim 6 wherein said substrate comprises an array of chips respectively separated from each other by kerf regions and said test transistor is located in said kerf, and including the further step of removing the kerf and test transistor by dicing the substrate into chips after the completion of testing using the test transistor.

* * * * *

UNITED STATES PATENT OFFICE
CERTIFICATE OF CORRECTION

PATENT NO. : 3,774,088

DATED : November 20, 1973

INVENTOR(S) : Ingrid E. Magdo and Steven Magdo

It is certified that error appears in the above-identified patent and that said Letters Patent are hereby corrected as shown below:

Column 4, Line 23 (In the Application, Page 9, Line 7) — "imited" should be -- limited --

In the Claims

Claim 6

Column 9, Line 6 (In the Application, Page 21, Line 29) — "directional" should be -- identical --

Signed and Sealed this

*fourth* Day of *November 1975*

[SEAL]

*Attest:*

RUTH C. MASON
*Attesting Officer*

C. MARSHALL DANN
*Commissioner of Patents and Trademarks*